US007286432B2

United States Patent
Heilmann et al.

(10) Patent No.: US 7,286,432 B2
(45) Date of Patent: Oct. 23, 2007

(54) TEMPERATURE UPDATE MASKING TO ENSURE CORRECT MEASUREMENT OF TEMPERATURE WHEN REFERENCES BECOME UNSTABLE

(75) Inventors: Ben Heilmann, Raleigh, NC (US); David Herbert, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 11/187,321

(22) Filed: Jul. 22, 2005

(65) Prior Publication Data

US 2007/0019488 A1    Jan. 25, 2007

(51) Int. Cl.
*G11C 7/04*    (2006.01)
(52) U.S. Cl. ............... 365/211; 365/233; 365/189.09; 365/189.07
(58) Field of Classification Search ............ 365/211, 365/233, 189.09, 189.07
See application file for complete search history.

(56) References Cited

U.S. PATENT DOCUMENTS

| 7,139,214 B2 * | 11/2006 | Atwood et al. ........ 365/230.05 |
| 7,158,433 B2 * | 1/2007 | Riho et al. ................. 365/222 |
| 2005/0105352 A1 | 5/2005 | Lee |

* cited by examiner

*Primary Examiner*—Tuan T. Nguyen
(74) *Attorney, Agent, or Firm*—Patterson & Sheridan, L.L.P.

(57) ABSTRACT

Embodiments of the invention generally provide methods and apparatuses for updating a temperature measurement. In one embodiment, the temperature measurement is performed by a temperature sensor using one or more reference signals. A signal to update the temperature measurement is received. A determination is made of whether the clocked standby mode signal has changed within a period of time prior to receiving the signal to update the temperature measurement. If the clocked standby mode signal has changed within the period of time, the signal to update the temperature sensor is masked. If the clocked standby mode signal has not changed within the period of time, the temperature measurement is updated using the signal to update the temperature measurement.

15 Claims, 6 Drawing Sheets

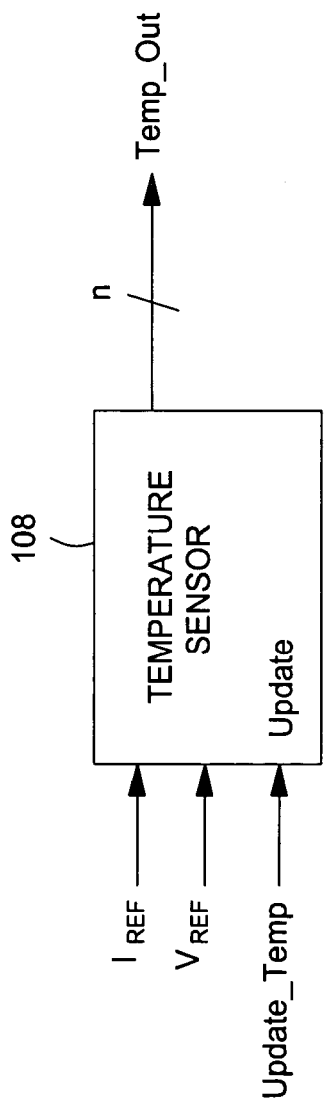
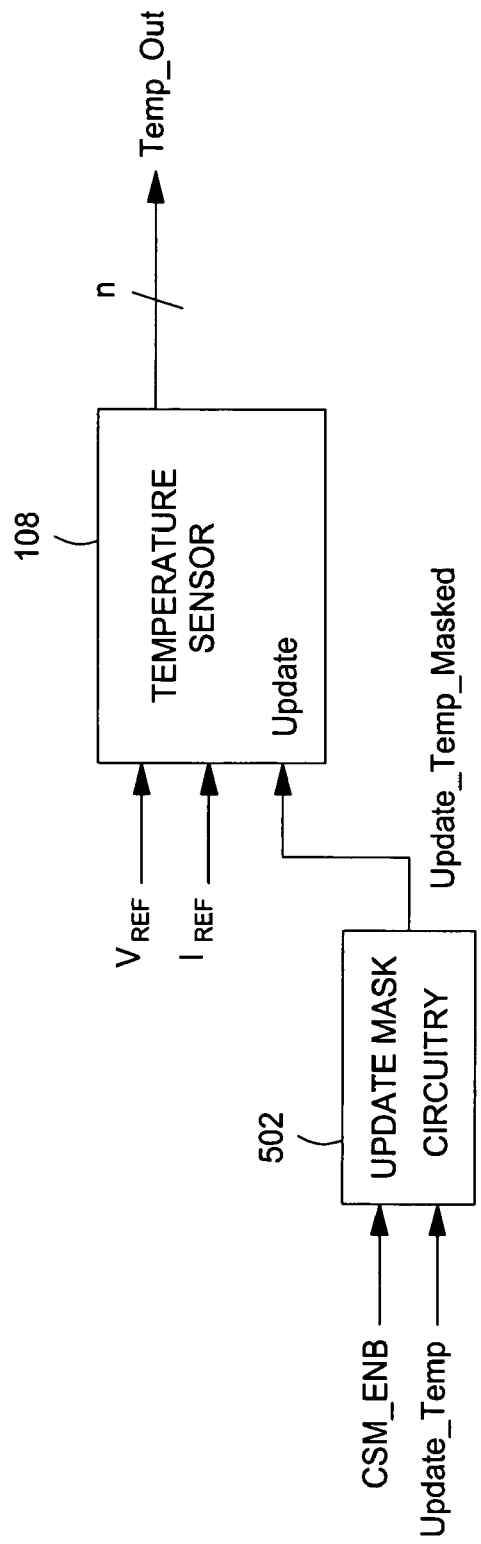

TEMPERATURE UPDATE MASKING TO ENSURE CORRECT MEASUREMENT OF TEMPERATURE WHEN REFERENCES BECOME UNSTABLE

BACKGROUND OF THE INVENTION

1. Field of the Invention

Embodiments of the present invention generally relate to an improved implementation of clocked standby mode in a digital circuit.

2. Description of the Related Art

Modern integrated circuits (ICs), such as dynamic random access memory (DRAM) devices typically contain one or more memory arrays for storing information. Each bit of information within the array may be stored as a charge within the array. Due to inherent imperfections in storing the charge (e.g., leakage currents), the charges in the array may deteriorate, causing the information stored by the charge to be lost. To avoid this information loss, each cell in the memory arrays must be periodically recharged. The process of recharging the cells in a memory array is referred to as a refresh. The frequency of refresh operations necessary to maintain the data in the memory array is referred to as the refresh rate.

The rate at which charges in a memory array deteriorate may vary with operating characteristics of the IC. For instance, leakage currents which cause charge deterioration may increase with the operating temperature of the IC. In some cases, a high refresh rate may be chosen such that no information is lost from the memory array, regardless of the operating temperature of the IC. However, refreshing memory arrays typically consumes power, and a high refresh rate may lead to high power consumption of the IC device. In some cases, for instance where the IC is used in a battery-operated mobile device, high power consumption may be undesirable.

To decrease power consumption of the IC device and avoid unnecessarily high refresh rates, some ICs may adjust the refresh rate based on the operating temperature of the IC. When the temperature of the IC is high, the refresh rate may be increased. When the temperature of the IC is low, the refresh rate may be decreased. Thus, regardless of the temperature, the refresh rate may remain just high enough to prevent memory loss in the memory arrays. Also, by maintaining a minimum refresh rate necessary for proper functioning of the IC, power consumption of the IC may be minimized. Dynamically adjusting the refresh rate of a memory device may be referred to as temperature compensated self-refresh, or TCSR.

TCSR in an IC may be implemented with a temperature sensor and control circuit. The temperature sensor may periodically measure the temperature of the IC, and the control circuit may adjust the refresh rate of the memory arrays based on the measured temperature. In order to measure the temperature of the IC, the temperature sensor may contain a temperature sensitive diode. The temperature sensor may compare a voltage and/or a current in the temperature sensitive diode to a reference voltage and/or a reference current. Based on the difference between the compared voltages and/or currents, the temperature of the device may be accurately measured.

Each reference voltage and reference current used by a temperature sensor may be generated by a voltage generation circuit. When used to generate a reference voltage and/or reference current, the voltage generation circuit may be referred to as a reference voltage generator. IC devices often operate using various internally generated reference voltages in an effort to reduce sensitivity to fluctuating external voltage supplies. A typical IC, such as a DRAM device, may include many such voltage generation circuits, configured to generate a wide range of reference voltages and output voltages, which may include voltages that are positive with respect to a ground reference (e.g., a boosted wordline voltage or $V_{PP}$) and voltages that are negative with respect to a ground reference (e.g., a back-bias voltage, $V_{BB}$, or negative wordline voltage, $V_{NWL}$).

Each voltage generation circuit on a given device may consume power while generating a reference voltage or an output voltage. In order to conserve the power consumed by the IC device, each voltage generation circuit may be placed in a mode (referred to as a standby mode) where the circuit is selectively enabled and disabled. In the standby mode, the voltage generation circuit may be enabled while the required voltage is being used by the IC device. For instance, if the IC device is a memory device, the voltage generation circuit may be enabled just before the memory device uses the output of the voltage generation circuit to perform an access (e.g., a read, write, or refresh). While the voltage generation circuit is enabled, the voltage generation circuit may consume power and generate the required voltage. When the memory device is not being accessed, the voltage generation circuit may be disabled. While the voltage generation circuit is disabled, the circuit may consume less power and the required voltage may not be generated. Because each access to the memory device may be timed according to a clock (e.g., each access to the memory device may occur on the rising edge of a clock), a clock signal may be used to selectively enable and disable the voltage generation circuit just prior to each access. Accordingly, the standby mode may be referred to as a clocked standby mode (CSM).

In some cases, enabling and disabling the clocked standby mode may cause fluctuations in the reference voltage and or reference current of the reference voltage generator. These fluctuations may occur for short periods after the clocked standby mode is either enabled or disabled and may last until the reference voltage generator has adjusted to the change in the clocked standby mode. Because the reference voltage and/or reference current may fluctuate, the temperature sensor, which uses the voltage and/or current to measure the temperature, may measure an incorrect temperature. If the incorrectly measured temperature is too large, the refresh rate of the IC may be increased, leading to unnecessary power consumption. If the incorrectly measured temperature is too small, the refresh rate of the IC may be unnecessarily decreased, possibly leading to memory loss and/or malfunction of the IC. Thus, temperature sensors which use reference signals affected by a clocked standby mode may measure temperatures incorrectly in some cases, leading to malfunction of the IC.

Accordingly, what is needed are improved methods and apparatuses for measuring the temperature of a device that utilizes a standby mode.

SUMMARY OF THE INVENTION

Embodiments of the invention generally provide methods and apparatuses for updating a temperature measurement. In one embodiment, the temperature measurement is performed by a temperature sensor using one or more reference signals. A signal to update the temperature measurement is received. A determination is made of whether the clocked standby mode signal has changed within a period of time prior to receiving the signal to update the temperature measurement. If the clocked standby mode signal has changed within the period of time, the signal to update the temperature sensor is masked. If the clocked standby mode signal has not changed within the period of time, the temperature measurement is updated using the signal to update the temperature measurement.

Another embodiment of the invention provides a circuit having a reference voltage generator, a clocked standby mode control circuit, a temperature sensor, and a control circuit. The reference voltage generator is configured to generate a reference signal. When a clocked standby mode is enabled, the clocked standby mode control circuit selectively enables and disables the reference voltage generator. The temperature sensor is configured to measure a temperature. The temperature sensor uses the reference signal to measure the temperature. The control circuit is configured to determine whether a signal for enabling and disabling the clocked standby mode has changed within a previous period of time. If the signal for enabling and disabling the clocked standby mode has not changed within a previous period of time, a signal for updating the measured temperature is generated by the control circuit.

Another embodiment of the invention provides a method for updating a temperature measurement. A determination is made of whether a clocked standby mode has been enabled or disabled within a predetermined period of time. If the clocked standby mode has not been enabled or disabled within the predetermined period of time, a temperature measurement taken before the clocked standby mode was enabled or disabled is updated.

In another embodiment of the invention, a memory device is provided. The memory device has a means for generating a reference signal, a means for measuring a temperature based on the reference signal, and a means for controlling the memory device. The means for controlling the memory device is configured to determine whether a clocked standby mode has been enabled or disabled with a predetermined amount of time, and, if not, generate a signal for updating the measured temperature.

Yet another embodiment of the invention provides a memory device having one or more memory arrays, a reference voltage or current generator configured to generate a reference signal, a clocked standby mode control circuit, a temperature sensor, and a control circuit. The memory arrays are periodically refreshed according to a refresh rate. The clocked standby mode control circuit, when enabled, selectively enables and disables the reference voltage or current generator. The temperature sensor is configured to measure a temperature of the memory device. The temperature sensor uses the reference signals to measure the temperature. The control circuit is configured to enable and disable the clocked standby mode and set the refresh rate using the temperature measured by the temperature sensor. The temperature update circuit is configured to determine whether the clocked standby mode has been enabled or disabled with a predetermined amount of time. If the clocked standby mode has not been enabled or disabled within the predetermined amount of time, the measured temperature is updated.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a circuit diagram depicting an exemplary temperature sensor circuit.

FIG. 5 is a block diagram depicting update mask circuitry which may prevent a temperature sensor from making an improper temperature measurement according to one embodiment of the invention.

DETAILED DESCRIPTION OF THE PREFERRED EMBODIMENT

Figure 1:
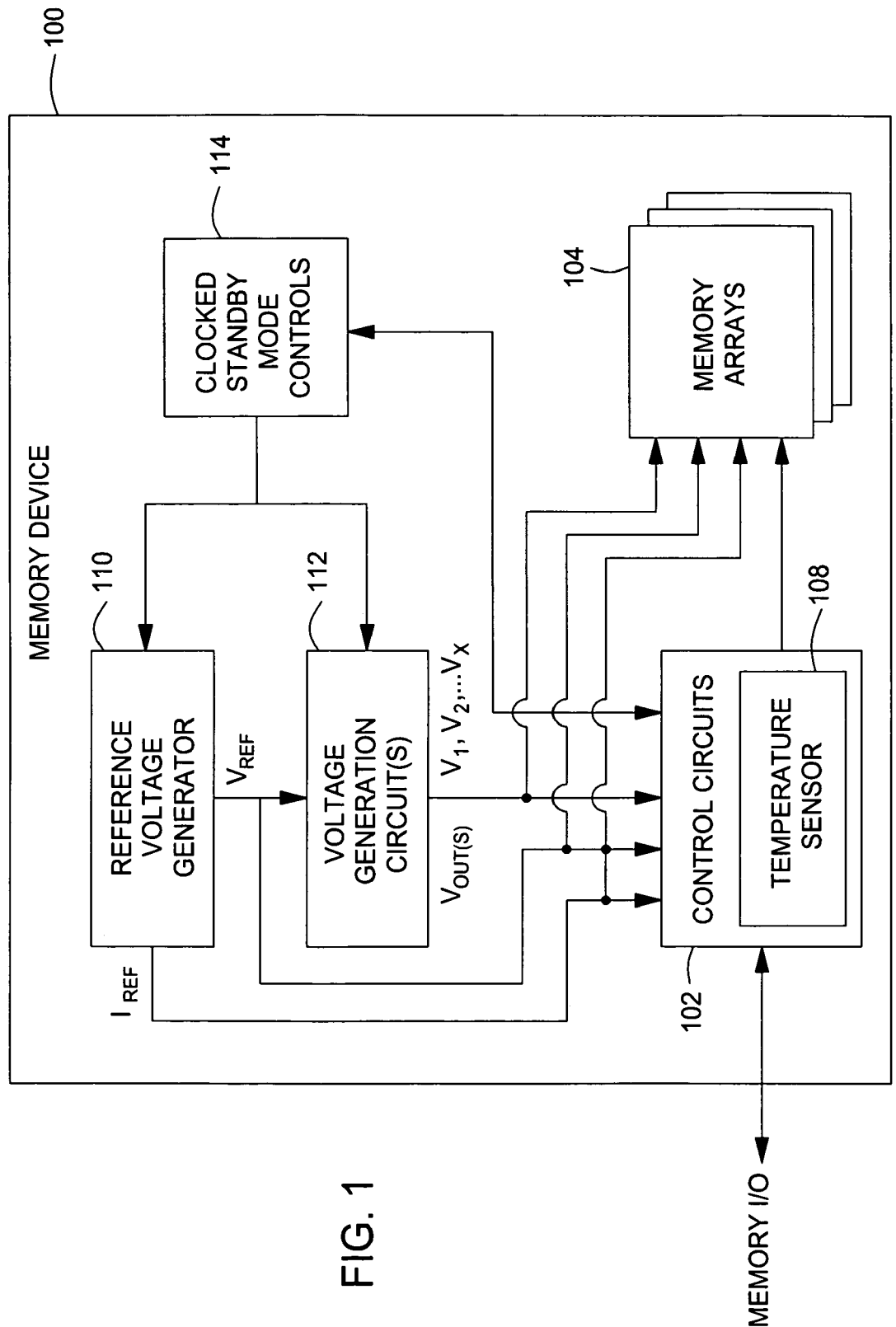
FIG. 1 is a block diagram depicting an exemplary memory device which utilizes a clocked standby mode.

Embodiments of the invention generally provide methods and apparatuses for updating a temperature measurement. One embodiment of the invention provides circuit having a reference voltage generator, a clocked standby mode control circuit, a temperature sensor, and a control circuit. The reference voltage generator is configured to generate a reference signal and the temperature sensor is configured to measure a temperature using the reference signal. When a clocked standby mode is enabled, the clocked standby mode control circuit selectively enables and disables the reference voltage generator. The control circuit is configured to determine whether a signal for enabling and disabling the clocked standby mode has changed within a previous period of time. If the signal for enabling and disabling the clocked standby mode has not changed within a previous period of time, a signal for updating the measured temperature is generated by the control circuit. In one embodiment, if the signal for enabling and disabling the clocked standby mode has changed within the previous period of time, the control circuit may mask the signal for updating the measured temperature. By masking the signal for updating the measured temperature, incorrect temperature measurements may be avoided and the circuit may be prevented from changing a refresh rate based on the temperature measurement to an improper value which may cause memory loss.

The circuits described herein may be used to advantage in any number of devices that utilize standby modes, reference signals, and sensors. However, to facilitate understanding, the following description will refer to memory devices, such as dynamic random access memory (DRAM) devices, as specific, but not limiting examples of devices in which the circuits described herein may be utilized. While described with respect to temperature sensors which use reference signals affected by a clocked standby mode, embodiments described herein may be used to advantage with any circuit which implements any type of power saving functions which affect any type of sensor used by the circuit. Further, while the following description may refer certain control signals as being asserted to high logic signals or lowered to low logic signals, those skilled in the art will recognize that such signal levels are merely exemplary and that any circuitry described herein may be configured to use any number of signals of any polarity and/or voltage level. Also, while some signals are referred to as originating from a given control circuit or device, it should be recognized that any described control signal may originate from any given circuit or device.

Any signal names described herein are exemplary, and in general embodiments of the invention may be implemented with any signal(s) bearing any name(s), and/or from any signal(s) derived from one or more such signals. Similarly, described implementations of certain circuits such as clocked standby mode controls, control circuits, voltage generators, reference voltage generators, voltage regulators, and so on are merely exemplary. In some cases, simplified implementations of such circuits are presented in order to better explain aspects of embodiments of the present invention. However, those skilled in the art will recognize that embodiments of the present invention may be adapted for use with any implementation or configuration of such circuits, including complicated and/or commercial implementations of such circuits.

An Exemplary Memory Device

FIG. 1 is a block diagram depicting an exemplary memory device 100 which utilizes a clocked standby mode. The memory device 100 may have control circuits 102 used to access one or more memory arrays 104 of the memory device 100. The control circuits 102 may have several internal circuits which may be used to configure and control the memory device. The control circuits 102 also have a temperature sensor 108 which may be used to measure the temperature of the memory device 100. Based on the measured temperature, one or more operating characteristics of the memory device 100, such as the refresh rate of the memory arrays, may be adjusted.

The memory device 100 may contain a reference voltage generator 110 and voltage generation circuit(s) 112. The reference voltage generator 110 may generate an output reference voltage $V_{REF}$ and an output reference current $I_{REF}$. The output reference voltage may be used by the voltage generation circuits 112 to generate output voltages $V_{OUT}(s)$, $V_1, V_2, \ldots V_X$. The output voltages $V_1, V_2, \ldots V_X$ of the voltage generation circuits 112 and the output reference voltage/current $V_{REF}$ and $I_{REF}$ of the reference voltage generator 110 may be supplied to the control circuits 102 of the memory device 100. The reference voltage, reference current, and output voltages may be used by the control circuit 102 to access (e.g., read, write or refresh) memory arrays 104. The reference voltage and current may also be used by the temperature sensor 108 in the control circuits 102 to measure the temperature of the memory device. The reference voltage generator 110 and the voltage generation circuit(s) 112 may be selectively enabled and disabled by clocked standby mode controls 114. The clocked standby mode controls 114 may be enabled or disabled by the control circuits 102.

Figure 2:
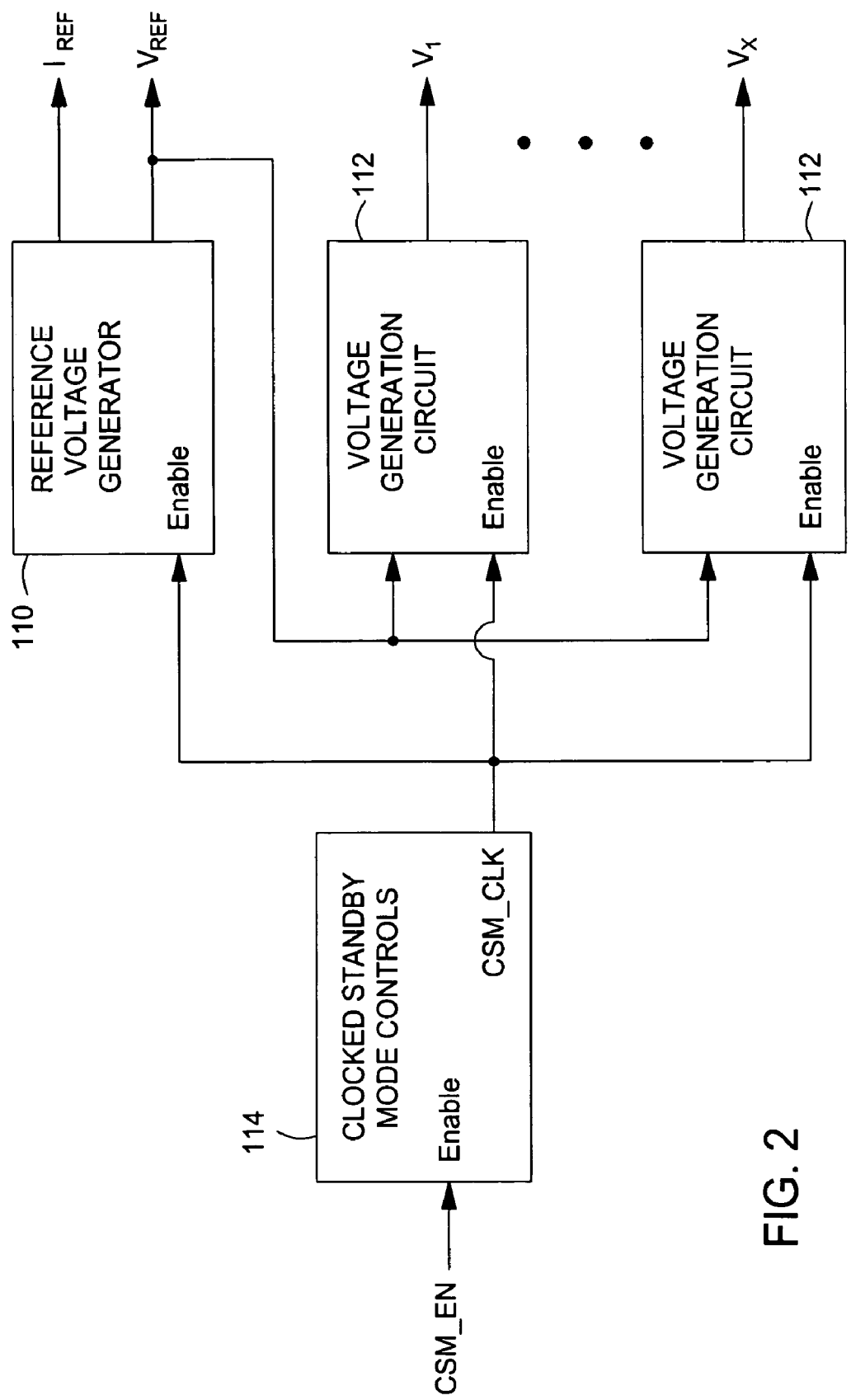
FIG. 2 is a block diagram depicting exemplary clocked standby mode controls which are used to selectively enable and disable one or more voltage generation circuits.

FIG. 2 is a block diagram depicting exemplary clocked standby mode controls 114 which are used to selectively enable the one or more voltage generation circuits 112 and the reference voltage generator 110. The input to the clocked standby mode controls 114 may be a signal to enable the clocked standby mode (referred to as CSM_ENB).

For example, when CSM_ENB is a high logic value, the clocked standby mode may be enabled and a clocked standby mode clock signal (CSM_CLK) may be generated by the clocked standby mode controls 114. In some cases, the clocked standby mode controls 114 may use another clock signal, referred to as a base clock signal (Base_CLK) to generate a clocked standby mode clock signal. The clocked standby mode control signal CSM_CLK may be used to selectively enable and disable the voltage generation circuits 112 and the reference voltage generator 110 just prior to each access to the memory arrays 104. When CSM_CLK is low, the voltage generation circuits 112 and the reference voltage generator 110 may be enabled, consuming power.

When CSM_CLK is high, the voltage generation circuits 112 and the reference voltage generator 110 may be disabled, conserving power. When CSM_ENB is a certain value (e.g., a low logic value), the clocked standby mode may be disabled, meaning that the voltage generation circuits 112 and the reference voltage generator 110 may constantly generate voltage output voltages, reference voltages, and reference currents. When the clocked standby mode is disabled, the CSM_CLK signal may be set to a constant value (e.g., a low logic value) in order to constantly enable the voltage generation circuits 112 and reference voltage generator 110.

An Exemplary Temperature Sensor

As previously described, the temperature sensor 108 in the memory device 100 may use the reference voltage $V_{REF}$ and reference current $I_{REF}$ to periodically measure the temperature of the memory device 100. FIG. 3 is a block diagram depicting the temperature sensor 108. The inputs to the temperature sensor 108 include the reference voltage $V_{REF}$, the reference current $I_{REF}$, and a signal for updating the temperature measurement, referred to as Update_Temp.

The Update_Temp signal may be a clock signal or a string of pulses. The Update_Temp signal may be generated in some instances by the control circuits 102, by a clock circuit, by other circuitry within the memory device 100, or in some cases may be received as an external signal of the memory device 100. Each time the Update_Temp signal is received (e.g., each time a rising edge or pulse of the Update_Temp signal is detected), the temperature sensor 108 may use $V_{REF}$ and $I_{REF}$ to measure and record the temperature of the memory device 100.

As previously described, when a clocked standby mode of the memory device 100 is enabled, the CSM_CLK signal may periodically enable and disable the reference voltage generator 110. In some cases, the $V_{REF}$ and $I_{REF}$ signals may only be valid or usable when the reference voltage generator is enabled by the CSM_CLK signal (e.g., when the CSM_CLK signal is a low logic value). Accordingly, in one embodiment, to ensure that the temperature sensor 108 only makes temperature measurements when the $V_{REF}$ and $I_{REF}$ signals are at an appropriate level, the Update_Temp pulse signals may be timed to coincide with periods when the reference voltage generator 110 is enabled (or shortly thereafter) and $V_{REF}$ and $I_{REF}$ are driven to appropriate levels (e.g., when CSM_CLK is lowered or shortly afterwards).

In any case, once the temperature sensor 108 has recorded the temperature of the memory device 100, the temperature sensor 108 may then output the recorded temperature as an n-bit number, Temp_Out. Temp_Out may then be used by the control circuits 102, for instance, to set a refresh rate of the memory device 100.

Figure 4:
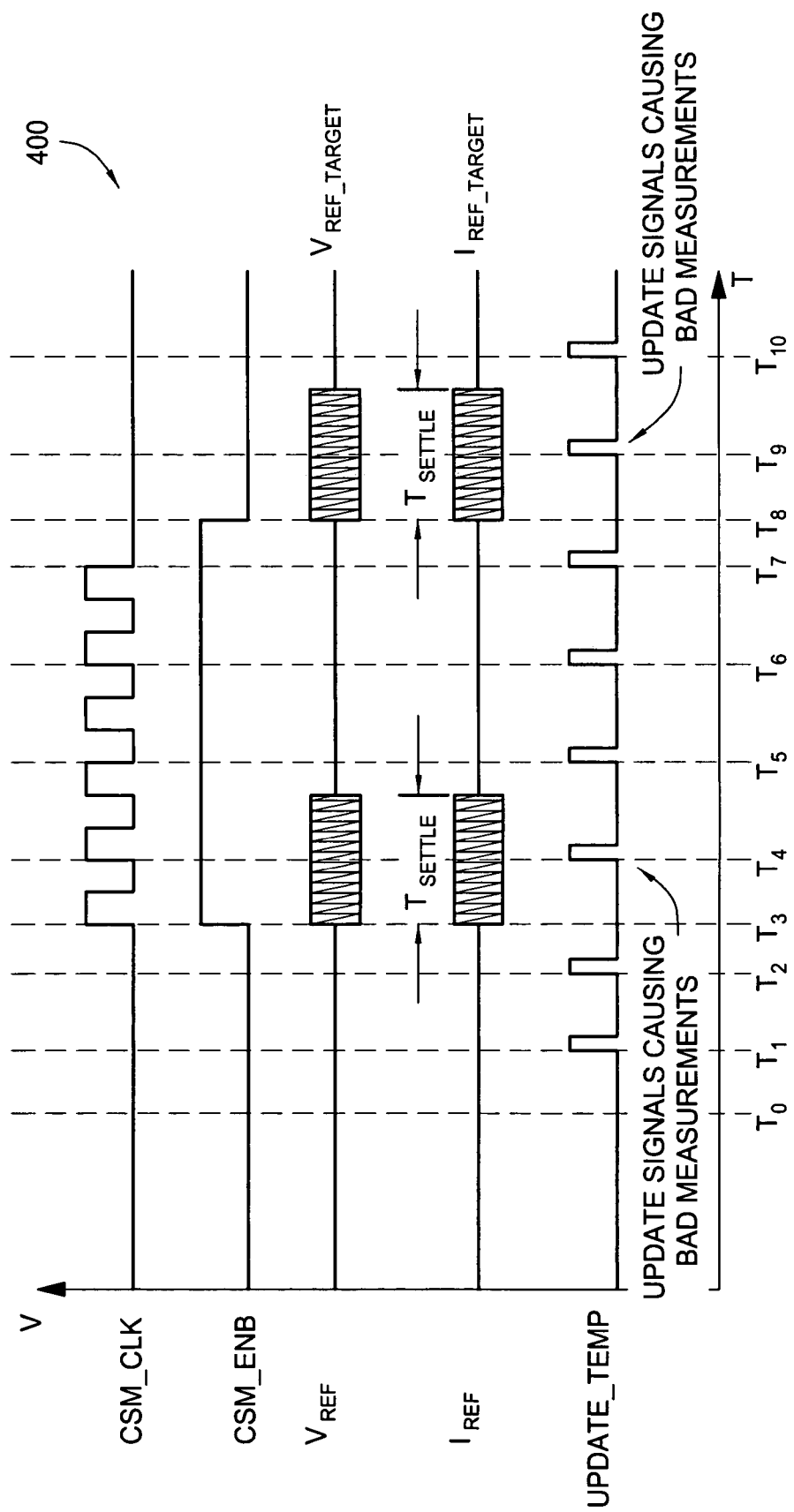
FIG. 4 is a timing diagram which depicts the effect of the clocked standby mode on a reference voltage and a reference current.

As previously described, enabling and disabling a clocked standby mode may cause fluctuations in the output voltage $V_{REF}$ of the reference voltage generator 110. FIG. 4 is a timing diagram 400 which depicts the effect of enabling and disabling a clocked standby mode on a reference voltage and reference current. At time T0, the CSM_ENB may be a low logic level, disabling the clocked standby mode and causing CSM_CLK to remain at a low logic level. When CSM_CLK remains low, the voltage generation circuits 112 and reference voltage generator 110 are constantly enabled. When the reference voltage generator 110 is constantly enabled the $V_{REF}$ and $I_{REF}$ signals may remain at stable values, referred to as $V_{REF\_TARGET}$ and $I_{REF\_TARGET}$.

When $V_{REF}$ and $I_{REF}$ are approximately equal to $V_{REF\_TARGET}$ and $I_{REF\_TARGET}$, the temperature sensor 108 may be able to take accurate temperature measurements. Thus, at times T1 and T2, the Update_Temp signal may be asserted, causing the temperature sensor 108 to use $V_{REF}$ and $I_{REF}$ to measure the temperature of the memory device 100. The temperature sensor 108 may then generate Temp_Out using the reference signals and the control circuits 102 may use Temp_Out to set a refresh rate of the memory arrays 104.

At time T3, the clocked standby mode control signal CSM_ENB may be raised from a low logic level to a high logic level, causing the clocked standby mode to be enabled. When the clocked standby mode is enabled, the clocked standby mode controls 114 may begin generating the clocked standby mode clock signal, CSM_CLK. Thus, at time T3 the CSM_CLK signal may be raised to a high logic level, disabling the reference voltage generator 110. When the clocked standby mode is initially enabled and the reference voltage generator 110 is disabled by the CSM_CLK signal, the $V_{REF}$ and $I_{REF}$ signals may begin to fluctuate. While the $V_{REF}$ and $I_{REF}$ signals are fluctuating, their value may be indeterminate. In other words, the signals may not be close to the desired values of $V_{REF\_TARGET}$ and $I_{REF\_TARGET}$.

The fluctuations in $V_{REF}$ and $I_{REF}$ may occur for several reasons. For instance, when the clocked standby mode is enabled and the reference voltage generator 110 is disabled, the sudden change in state of the reference voltage generator circuit 110 may cause a voltage increase or decrease in the reference voltage generator circuit 110 which may take time to dissipate. In any case, $V_{REF}$ and $I_{REF}$ may continue to fluctuate for a period of time after the clocked standby mode is enabled at time T3. The period of time for which $V_{REF}$ and $I_{REF}$ fluctuate may be referred to as $T_{SETTLE}$. $T_{SETTLE}$ is the amount of time necessary for the signals to settle at a steady value approximately equal to $V_{REF\_TARGET}$ and $I_{REF\_TARGET}$, respectively.

However, at time T4, before $T_{SETTLE}$ has elapsed and while $V_{REF}$ and $I_{REF}$ are still fluctuating, another Update_Temp pulse signal may be received. Because $V_{REF}$ and $I_{REF}$ may not be near the desired values of $V_{REF\_TARGET}$ and $I_{REF\_TARGET}$, the temperature sensor 108 may record an incorrect temperature. As previously described, if the incorrectly measured temperature is too large, the refresh rate of the memory device 100 may be increased, leading to unnecessary power consumption. If the incorrectly measured temperature is too small, the refresh rate of the memory device 100 may be unnecessarily decreased, possibly leading to memory loss and/or malfunction of the memory device 100.

Later, at times T5, T6, and T7 Update_Temp signals may be received while the clocked standby mode is enabled and after $V_{REF}$ and $I_{REF}$ have stabilized to values approximately equal to $V_{REF\_TARGET}$ and $I_{REF\_TARGET}$. Because $V_{REF}$ and $I_{REF}$ have stabilized to values approximately equal to $V_{REF\_TARGET}$ and $I_{REF\_TARGET}$, the temperature sensor 108 may correctly measure the temperature of the memory device 100 and may adjust the refresh rate to an appropriate level. However, at time T8, the CSM_ENB signal may be lowered to a low logic level, disabling the clocked standby mode. As a result, $V_{REF}$ and $I_{REF}$ may again fluctuate for a time $T_{SETTLE}$. Thus, when another Update_Temp pulse signal is received at time T9, an incorrect temperature measurement may be made. A correct measurement of the memory device's temperature may not be made until a subsequent Update_Temp signal is received at time T10, after the time $T_{SETTLE}$ has elapsed.

Exemplary Circuit for Preventing Incorrect Temperature Measurements Due to a Change in the Clocked Standby Mode According to one embodiment of the invention, the control circuits 102 may be modified by adding additional circuitry to prevent the temperature sensor from taking measurements when the reference voltages/currents are fluctuating. In one embodiment, the control circuits 102 may be modified by inserting additional circuitry which masks the temperature update signal Update_Temp for a period of time after any change in the clocked standby mode of the memory device. FIG. 5 is a block diagram depicting update mask circuitry 502 which may prevent the temperature sensor 108 from making an improper temperature measurement according to one embodiment of the invention.

The inputs to the update mask circuitry 502 may include the signal for enabling the clocked standby mode, CSM_ENB, and the signal for updating the temperature, Update_Temp. The output of the update mask circuitry may be a masked version of the signal for updating the temperature, Update_Temp_Masked. The Update_Temp_Masked signal may be used by the temperature sensor 108 in the same manner as the Update_Temp signal to determine when to measure and store the updated temperature of the memory device 100. The updated temperature of the memory device 100 may be used to set a refresh rate for one or more memory arrays 104 within the memory device 100.

According to one embodiment of the invention, the update mask circuitry may monitor CSM_ENB to determine whether a change in the clocked standby mode of the memory device 100 has occurred (e.g. whether a rising edge or a falling edge of CSM_ENB was received). If an Update_Temp signal pulse is received within time $T_{SETTLE}$ after a change in the clocked standby mode is detected, the update mask circuitry may mask (e.g. block) the Update_Temp signal pulse and Update_Temp_Masked may remain a low logic value. When the Update_Temp_Masked signal remains low, the temperature sensor 108 may not update the temperature measurement. If, however, an Update_Temp pulse signal is received and a change in the clocked standby mode has not occurred with the time $T_{SETTLE}$ preceding the received Update_Temp signal, then the Update_Temp signal may be transmitted to the temperature sensor 102 as a pulse signal from the Update_Temp_Masked signal.

Thus, the update mask circuitry 502 may prevent the temperature sensor 108 from updating the temperature measurement while $V_{REF}$ and $I_{REF}$ are fluctuating due to the change in clocked standby mode of the memory device 100. By preventing the temperature sensor 108 from updating the measured temperature while $V_{REF}$ and $I_{REF}$ are unstable, incorrect temperature measurements may be avoided and the memory device 100 may be prevented from changing the refresh rate to an improper value which may cause memory loss.

When the temperature measurement is not updated because the Update_Temp signal is masked, the temperature measurement and the refresh rate may remain at the values measured after the last received Update_Temp pulse signal before the change in the clocked standby mode. Because the temperature of the memory device 100 will typically not change very quickly (at least relative to the frequency of temperature measurements caused by the Update_Temp and Update_Temp_Masked signal pulses), the missed temperature measurement(s) from masking Update_Temp during time $T_{SETTLE}$ will likely have little effect on the adequacy of the previously chosen refresh rate.

Figure 6:
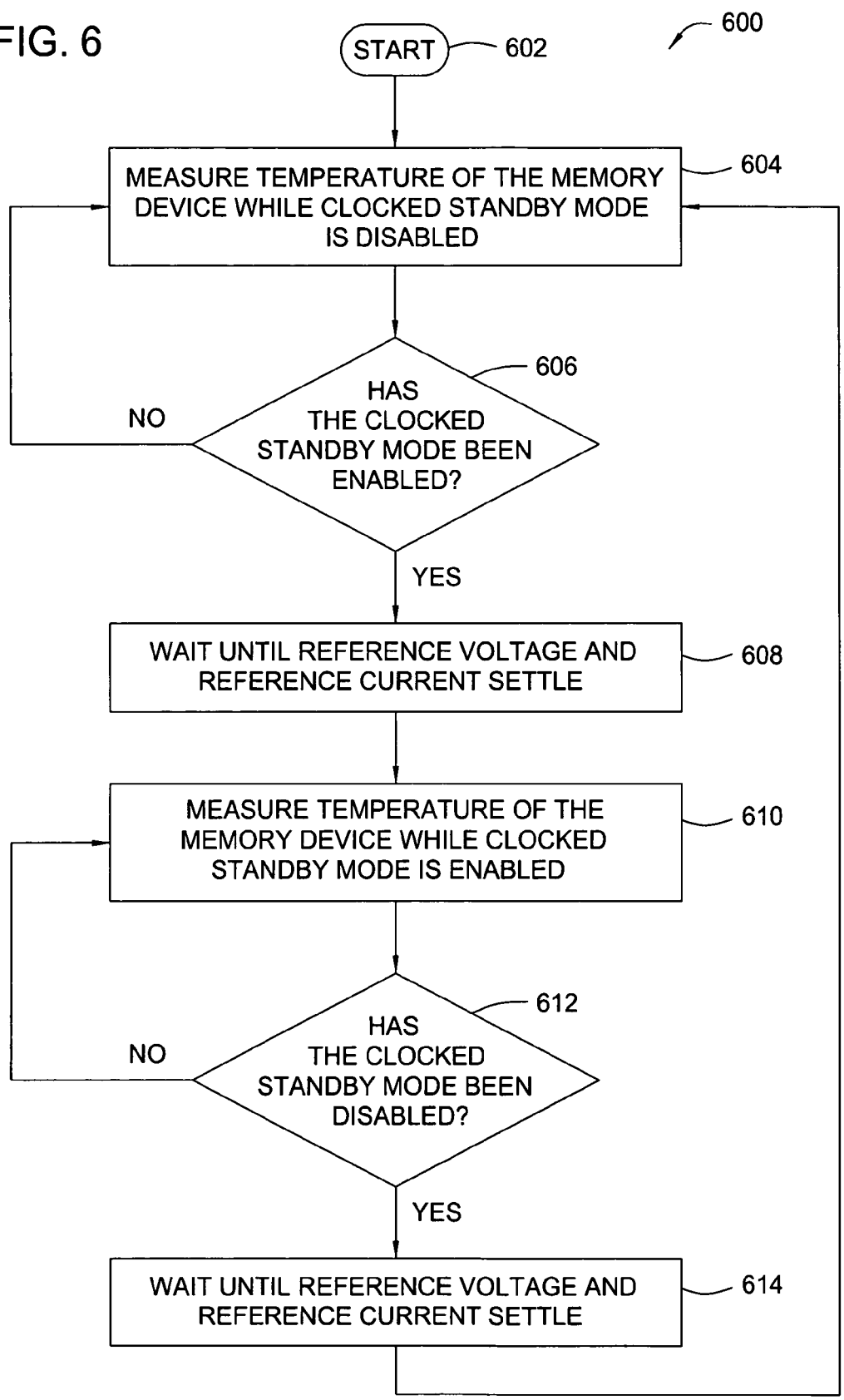
FIG. 6 is a flow diagram depicting a process for updating a temperature measurement according to one embodiment of the invention.

FIG. 6 is a flow diagram depicting a process 600 for updating a temperature measurement according to one embodiment of the invention. The process 600 may begin at step 602 and continue to step 604 where clocked standby mode is initially disabled and the temperature of the memory device 100 is measured.

At step 606 a determination may be made of whether the clocked standby mode has been enabled. If the clocked standby mode has not been enabled, the process may continue to step 604 where temperature continues to be measured regularly. If, however, the clocked standby mode is enabled, the process 600 may proceed to step 608 where the process 600 of updating the temperature waits until the reference voltage $V_{REF}$ and reference current $I_{REF}$ settle. After the reference voltage and reference current settle, the temperature of the memory device 100 may again be measured while the clocked standby mode is enabled.

At step 612 a determination may be made of whether the clocked standby mode has been disabled. If the clocked standby mode has not been disabled, the temperature of the memory device 100 may continue to be measured regularly at step 610 while the clocked standby mode is enabled. If, however, the clocked standby mode is disabled, the process 600 may wait at step 614 until the reference voltage $V_{REF}$ and reference current $I_{REF}$ settle to a value approximately equal to $V_{REF\_TARGET}$ and $I_{REF\_TARGET}$ respectively. Then, after $V_{REF}$ and $I_{REF}$ settle, the process 600 may continue to measure the temperature of the memory device at step 604.

Figure 7:
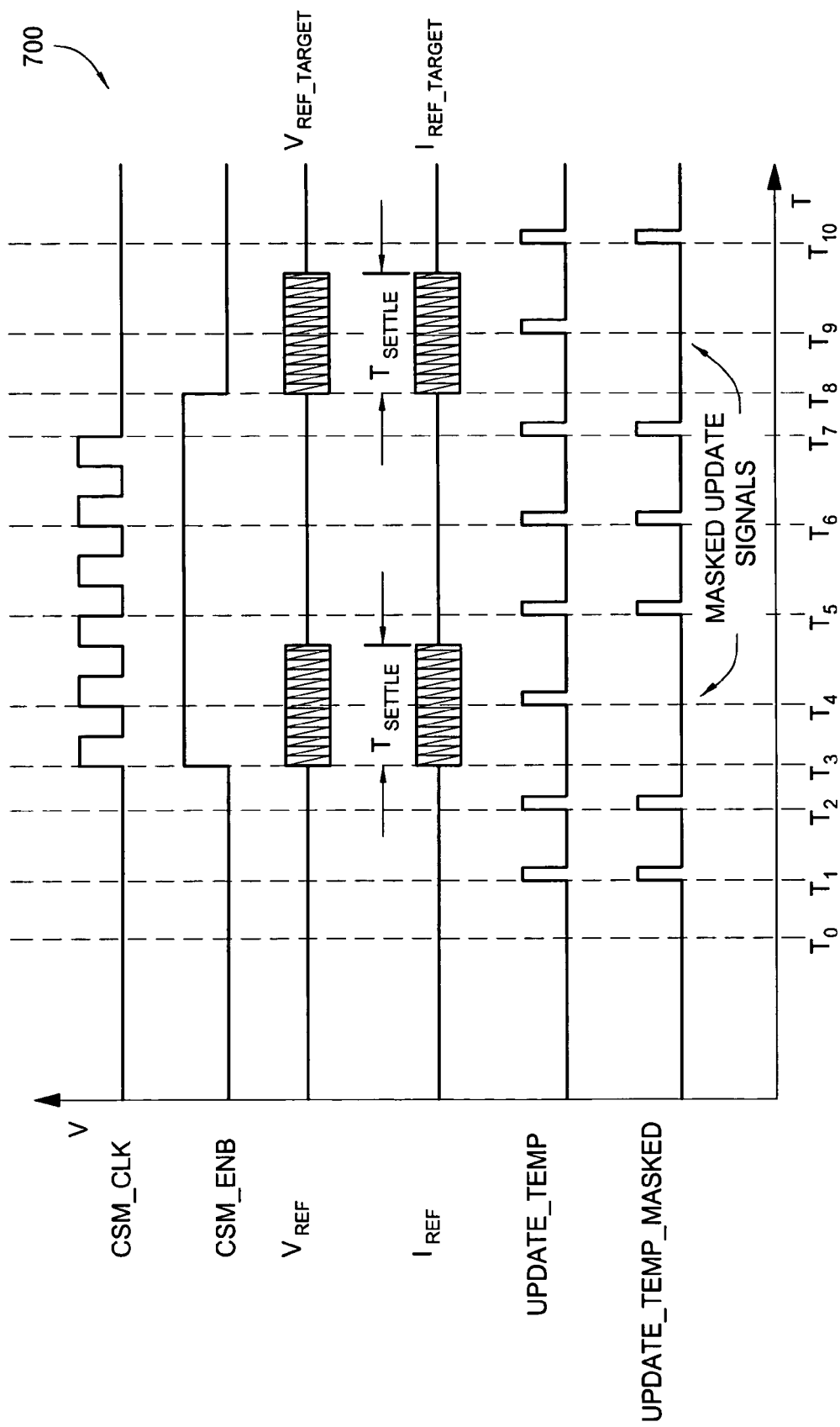
FIG. 7 is a timing diagram which depicts a masked temperature update signal used to update a temperature measurement of a memory device according to one embodiment of the invention.

FIG. 7 is a timing diagram 700 which depicts the masked temperature update signal Update_Temp_Masked used to update the temperature measurement of the memory device 100 according to one embodiment of the invention. As previously described, at time T0, the CSM_ENB may be a low logic level, disabling the clocked standby mode and causing CSM_CLK to remain at a low logic level. While the clocked standby mode is continuously disabled, the $V_{REF}$ and $I_{REF}$ signals may remain at a value approximately equal to $V_{REF\_TARGET}$ and $I_{REF\_TARGET}$ respectively.

At times T1 and T2, the Update_Temp signal may be asserted. The update mask circuitry 502 may determine at times T1 and T2 that no change in the clocked standby mode has occurred for a time $T_{SETTLE}$ preceding times T1 and T2. Because the update mask circuitry 502 has not detected any recent change in the clocked standby mode signal CSM_ENB, the received Update_Temp signals may not be masked and Update_Temp_Masked may be asserted at times T1 and T2, causing the temperature sensor 108 to use $V_{REF}$ and $I_{REF}$ to measure the temperature of the memory device 100.

However, at time T3, the clocked standby mode control signal CSM_ENB may be raised from a low logic level to a high logic level, causing the clocked standby mode to be enabled. When the clocked standby mode is enabled, the clocked standby mode controls 114 may begin generating the clocked standby mode clock signal, CSM_CLK. The update mask circuitry 502 may detect this change in CSM_ENB. Thus, when an Update_Temp signal is received at time T4, $V_{REF}$ and $I_{REF}$ may still be fluctuating and the update mask circuitry 502 may mask the received Update_Temp signal. Thus, at time T4, Update_Temp_Masked may remain at a low logic level. Because Update_Temp_Masked remains at a low logic level, the temperature sensor 108 may not update the temperature and may thus avoid an erroneous measurement.

Later, at times T5, T6, and T7 Update_Temp signals may be received while the clocked standby mode is enabled and after $V_{REF}$ and $I_{REF}$ have stabilized. Accordingly, when the Update_Temp signals are received, the update mask circuitry 502 may determine that the time $T_{SETTLE}$ since the clocked standby mode was changed at T3 has expired. Accordingly, the received signals may not be masked and the Update_Temp_Masked signal may be asserted at times T5, T6, and T7, causing the temperature sensor 108 to update the temperature measurements.

At time T8, the CSM_ENB signal may be lowered to a low logic level, disabling the clocked standby mode. Again, the update mask circuitry 502 may detect the change in CSM_ENB. Thus, when an Update_Temp signal is received at time T9, $V_{REF}$ and $I_{REF}$ may still be fluctuating and the update mask circuitry 502 may again mask the received Update_Temp signal. Thus, at time T9, the Update_Temp_Masked signal may remain at a low logic level. Because Update_Temp_Masked remains at a low logic level, the temperature sensor 108 may not update the temperature and may thus avoid another possibly erroneous measurement. Later, another Update_Temp signal may be received by the update mask circuitry 502 at time T10 after the time $T_{SETTLE}$ has expired. Because the time $T_{SETTLE}$ has expired, the Update_Temp_Masked signal may be asserted by the update mask circuitry 502, causing the temperature sensor 108 to update the temperature measurement.

In some cases, the clocked standby mode may be enabled and disabled (or vice versa) within a short period of time such that the $T_{SETTLE}$ period from enabling the mode and the $T_{SETTLE}$ period from disabling the standby mode overlap or are so close that no Update_Temp_Masked pulse signals are issued to the temperature sensor 108 while the clocked standby mode is being enabled and disabled. Thus, according to one embodiment of the invention, where the $T_{SETTLE}$ periods from enabling and disabling the clocked standby mode are close in time or overlap, the update mask circuitry 502 may mask more signals than normally would be masked, and the temperature sensor 108 may not update the temperature measurement as frequently. However, as previously mentioned, because the temperature of the memory device 100 may not change very quickly, the missed temperature measurement(s) masked during the combined $T_{SETTLE}$ times will have little effect on the accuracy of the previously chosen refresh rate.

The update mask circuitry 502 may contain any suitable circuitry for masking the Update_Temp signal. In one embodiment, when the update mask circuitry 502 detects a change in the clocked standby mode of the memory device 100, the update mask circuitry may start a counter or a timer. If an Update_Temp pulse signal is received and time $T_{SETTLE}$ has not expired since the change in the clocked standby mode was detected, then the Update_Temp signal may be masked, the Update_Temp_Masked signal may remain a low logic level, and the temperature measurement may not be updated by the temperature sensor 108. If, however, the time $T_{SETTLE}$ has expired since the last change in the clocked standby mode, the Update_Temp signal may be transmitted to the temperature sensor 108 by raising the Update_Temp_Masked signal. Because time $T_{SETTLE}$ has expired, $V_{REF}$ and $I_{REF}$ may be approximately equal to $V_{REF\_TARGET}$ and $I_{REF\_TARGET}$, and a correct temperature measurement may be made by the temperature sensor 108.

In another embodiment of the invention, when the update mask circuitry 502 detects a change in the clocked standby mode, the update mask circuitry 502 may mask a set number of Update_Temp signals such that a known period of time (e.g., the frequency of the Update_Temp signal times the number of masked signals) greater than $T_{SETTLE}$ passes before the temperature sensor 108 updates the temperature measurement. In general, the update mask circuitry 502 may mask the Update_Temp signal using any circuitry and signals known to those skilled in the art.

In yet another embodiment of the invention, temperature update circuitry may be used to generate the Update_Temp signal. Where the Update_Temp signal is generated by temperature update circuitry, the Update_Temp signal may be used directly by the temperature sensor 108 to update the temperature measurement. The temperature update circuitry may contain any suitable circuitry for generating the Update_Temp signal (e.g. a clock or timer circuitry). In other cases the temperature update circuitry may use an external circuit to generate the Update_Temp signal. In one embodiment, the temperature update circuitry may generate Update_Temp pulse signals which may be used by the temperature sensor 108 to update the temperature measurement. If the temperature update circuitry detects a change in the clocked standby mode of the memory device 100, the temperature update circuitry may not generate the Update_Temp signals for a predefined time period (e.g. $T_{SETTLE}$).

$T_{SETTLE}$, the amount of time necessary for the $V_{REF}$ and $I_{REF}$ signals to settle, may be determined at any convenient time during design, fabrication, testing, or use of the memory device 100, including during design of the memory device 100, after fabrication of the memory device and before packaging, during a testing phase of the memory device after packaging and before the memory device 100 has been installed as a component in another device, or after the memory device 100 has been installed.

Based on the determined length of time $T_{SETTLE}$, the time for which update signals are masked may be selected. The selected time for masking the update signals may be referred to as the masking time, or $T_{MASK}$. In one embodiment of the invention, $T_{MASK}$ may be selected such that $T_{MASK}$ is equal to the largest measured value of $T_{SETTLE}$. In another embodiment, $T_{MASK}$ may be selected such that $T_{MASK}$ is slightly larger than a largest expected value of $T_{SETTLE}$. In yet another embodiment, $T_{MASK}$ may be selected such that the Update_Temp signal is masked only until $V_{REF}$ and $I_{REF}$ have settled enough such that the temperature measured by the temperature sensor 108 falls within an acceptable margin of error for the memory device design.

Also, in some cases, $T_{SETTLE}$ may be different depending on whether the clocked standby mode is being enabled ($T_{SETTLE\_ENABLE}$) or disabled ($T_{SETTLE\_DISABLE}$). Accordingly, the update mask circuit 502 may mask any occurring Update_Temp signals for different periods of time depending on whether the clocked standby mode is being enabled (a rising edge of CSM_ENB) or disabled (a falling edge of CSM_ENB). In some cases, $T_{MASK}$ may also be adjusted according to other operating characteristics of the memory device. For instance, $T_{MASK}$ may be adjusted based on the number/frequency of recent accesses being performed by the memory device 100, based on the clock frequency of the memory device 100, or based on whether the memory device 100 is using a partial array self refresh (PASR) function.

Once $T_{MASK}$ is selected, the value of $T_{MASK}$ (e.g., a binary number which represents the length of $T_{MASK}$ in a number of clock cycles or some other time measurement) may be programmed into the memory device 100. The programming may be performed by placing appropriate hardware components (e.g. latches, counters, timers, and/or read-only memory (ROM)) in the memory device 100 during a design phase of the device. Where the $T_{SETTLE}$ period is determined after the device 100 has been fabricated but before the device has been packaged, the time for which the update signals are masked may be stored in one or more fuses on the memory device 100. The fuses may include electronically programmable fuses (e-fuses) or laser programmable fuses. After the device has been packaged and/or installed, the time for which the update signals are masked may be stored in e-fuses or a flash memory portion of the memory device 100. The time for which the update signals are masked may also be selected when the memory device 100 is turned on and initialized by another device. Where another device selects the time for which the update signals are masked, the time may be set using a command issued to the memory device and may be stored, for instance, in a special mode register (SMR) of the memory device.

According to another embodiment of the invention, the control circuits 102 may avoid incorrect temperature measurements from the temperature sensor 108 in other ways. For instance, each time a change in the clocked standby mode is detected, the control circuits 102 may record the time of the change in a register or another portion of memory. Based on the time recorded in the register, the control circuits 102 may take several actions. In one embodiment, the control circuits 102 may not issue the Update_Temp signal if the expired time (as measured by the recorded time) is less than $T_{SETTLE}$. Optionally, if the expired time is less than $T_{SETTLE}$, the control circuits 102 may not adjust the refresh rate based on the measured temperature or may not read the measured temperature until the expired time since the last clocked standby mode change is greater than $T_{SETTLE}$ and another temperature measurement has been made by the temperature sensor 108.

While embodiments are described herein with respect to one or more voltages affected by a clocked standby mode, it is also contemplated that embodiments of the invention may be used to effect in any situation where a reference voltage is affected by any operating characteristics of an integrated circuit. Also, as previously mentioned, while described with respect to a temperature sensor, embodiments of the invention may be used to effect with any type of sensor which utilizes a voltage such as, for example, a reference voltage.

Furthermore, while the foregoing is directed to embodiments of the present invention, other and further embodiments of the invention may be devised without departing from the basic scope thereof, and the scope thereof is determined by the claims that follow.

What is claimed is:

1. A circuit comprising:
   a reference voltage generator configured to generate a reference signal;
   a clocked standby mode control circuit which, when a clocked standby mode is enabled, selectively enables and disables the reference voltage generator;
   a temperature sensor configured to measure a temperature, wherein the temperature sensor uses the reference signal to measure the temperature; and
   a control circuit configured to:
      determine whether a signal for enabling and disabling the clocked standby mode has changed within a previous period of time; and if the signal for enabling and disabling the clocked standby mode has not changed within a previous period of time, generate a signal for updating the measured temperature.

2. The circuit of claim 1, wherein the control circuit is further configured to:
receive the signal for updating the measured temperature; and
mask the signal for updating the measured temperature if the signal for enabling and disabling the clocked standby mode has changed within the previous period of time.

3. The circuit of claim 1, wherein the signal for measuring the temperature is a periodic signal.

4. The circuit of claim 3, wherein the signal for measuring the temperature comprises a series of pulses, wherein each pulse received by the temperature sensor causes the temperature sensor to measure the temperature using the reference signal.

5. The circuit of claim 1, wherein the period of time is programmed into nonvolatile memory of the circuit.

6. A method for updating a temperature measurement comprising:
determining if a clocked standby mode has been enabled or disabled within a predetermined period of time; and
if the clocked standby mode has not been enabled or disabled within the predetermined period of time, updating a temperature measurement taken before the clocked standby mode was enabled or disabled.

7. The method of claim 6, further comprising:
maintaining the temperature measurement taken before the clocked standby mode was enabled or disabled if the clocked standby mode has been enabled or disabled within the predetermined period of time.

8. The method of claim 6, wherein determining if a clocked standby mode has been enabled or disabled within a predetermined period of time comprises:
receiving a signal for enabling and disabling the clocked standby mode;
if a rising edge or falling edge of the signal for enabling and disabling the clocked standby mode is detected, initializing a timer which measures a time period since the rising edge or falling edge of the signal was detected.

9. A memory device comprising:
means for generating a reference signal;
means for measuring a temperature based on the reference signal; and
means for controlling the memory device, configured to determine whether a clocked standby mode has been enabled or disabled with a predetermined amount of time, and, if not, generate a signal for updating the measured temperature.

10. The memory device of claim 9, wherein the means for controlling the memory device does not generate the signal for updating the measured temperature if the clocked standby mode has been enabled or disabled within the predetermined amount of time.

11. The memory device of claim 9, wherein updating the measured temperature comprises generating a pulse signal, wherein the means for measuring the temperature is configured to measure the temperature using the reference signal when the generated pulse signal is received.

12. A memory device comprising:
one or more memory arrays, wherein the memory arrays are periodically refreshed according to a refresh rate;
a reference voltage generator configured to generate a reference signal;
a clocked standby mode control circuit which, when a clocked standby mode is enabled, selectively enables and disables the reference voltage generator;
a temperature sensor configured to measure a temperature of the memory device, wherein the temperature sensor uses the reference signal to measure the temperature; and
a control circuit configured to:
enable and disable the clocked standby mode; and
set the refresh rate using the temperature measured by the temperature sensor;
a temperature update circuit configured to:
determine whether the clocked standby mode has been enabled or disabled with a predetermined amount of time; and
if the clocked standby mode has not been enabled or disabled within the predetermined amount of time, updating the measured temperature.

13. The memory device of claim 12, wherein the temperature measurement is not updated if the clocked standby mode has been enabled or disabled within the predetermined amount of time.

14. The memory device of claim 12, wherein updating the measured temperature comprises generating a pulse signal, wherein the temperature sensor is configured to measure the temperature using the reference signal when the generated pulse signal is received.

15. The memory device of claim 14, wherein the pulse signal is asserted when reference voltage generator is enabled or shortly thereafter.

* * * * *